US007586961B2

(12) United States Patent
Alcock et al.

(10) Patent No.: US 7,586,961 B2
(45) Date of Patent: Sep. 8, 2009

(54) LASER SYSTEMS

(75) Inventors: Ian Peter Alcock, Petersfield (GB); David James Pointer, Southampton (GB); David Anthony Egan, Bournemouth (GB)

(73) Assignee: Point Source Limited, Southampton (GB)

( * ) Notice: Subject to any disclaimer, the term of this patent is extended or adjusted under 35 U.S.C. 154(b) by 0 days.

(21) Appl. No.: 11/535,603

(22) Filed: Sep. 27, 2006

(65) Prior Publication Data

US 2007/0098028 A1 May 3, 2007

(30) Foreign Application Priority Data

Sep. 28, 2005 (GB) .................................. 0519761.1

(51) Int. Cl.
*H01S 3/13* (2006.01)

(52) U.S. Cl. .............................. 372/29.015; 372/29.02; 372/29.014

(58) Field of Classification Search .............. 372/29.02, 372/29.015, 29.014
See application file for complete search history.

(56) References Cited

U.S. PATENT DOCUMENTS

| 5,120,953 | A | 6/1992 | Harris |
| 5,175,641 | A | 12/1992 | Boerstler |
| 5,300,062 | A | 4/1994 | Ueno |
| 5,580,471 | A | 12/1996 | Fukumoto |
| 6,167,173 | A | 12/2000 | Schoeppe |
| 6,222,961 | B1 | 4/2001 | Engelhardt |
| 6,276,843 | B1 | 8/2001 | Alcock |
| 6,280,098 | B1 | 8/2001 | Alcock |
| 6,404,522 | B1 * | 6/2002 | Handelman .................. 398/79 |
| 6,796,720 | B2 | 9/2004 | Alcock |
| 7,014,369 | B2 | 3/2006 | Alcock |
| 2002/0085594 | A1 * | 7/2002 | Pezeshki et al. ............... 372/20 |
| 2003/0152336 | A1 | 8/2003 | Gurevich |
| 2003/0189711 | A1 * | 10/2003 | Orr et al. ..................... 356/484 |
| 2004/0067065 | A1 * | 4/2004 | Uesaka ........................ 398/194 |
| 2007/0019907 | A1 | 1/2007 | Alcock |

FOREIGN PATENT DOCUMENTS

| EP | 0279932 | 8/1988 |
| GB | 2325057 | 11/1998 |

(Continued)

OTHER PUBLICATIONS

Hawley, "Flow Cytometry Protocols, 2nd Edition," 2004 Humana Press, Inc.
Pawley, "Handbook of Biological Confocal Microscopy, 3rd Ed.," 2006, Springer Science+Business Media, LLC.
Piston, "Quantitative Imaging of Fluorescent Protein FRET," Microsc Microanal 11 (Suppl 2), 2005, pp. 270-271.

(Continued)

*Primary Examiner*—Dung T Nguyen
(74) *Attorney, Agent, or Firm*—Vierra Magen Marcus & DeNiro LLP

(57) ABSTRACT

A laser system 1 comprises six solid state diode laser modules 37.1 to 37.6 whose output beams are directly coupled into beam steering devices 38.1 to 38.6 and thereby routed to laser combining dichroic mirrors 39.1 to 39.6, which combine the individual laser beams into a single, co-aligned beam.

The combined laser beam is directed into an optical fiber 41.1 for delivery to a target optical instrument such as a microscope. The output beam from delivery optical fiber 41.1 is coupled to the target instrument via fiber output collimating optics 42.1.

The output of each of the diode lasers 37.1 to 37.6 is controlled by direct modulation of the lasers' control (drive) currents.

20 Claims, 8 Drawing Sheets

FOREIGN PATENT DOCUMENTS

| | | |
|---|---|---|
| GB | 2325058 | 11/1998 |
| GB | 2375617 | 11/2002 |
| GB | 2396222 | 6/2004 |
| GB | 2428492 | 1/2007 |

OTHER PUBLICATIONS

Spring, "Acousto-optic tunable filters improve optical microscopy," Laser Focus World, vol. 38 Pt 1, pp. 123-129, Jan. 2002.

* cited by examiner

LASER SYSTEMS

CLAIM OF PRIORITY

This application claims the benefit of U.K. Patent Application No. 0519761.1, dated Sep. 28, 2005.

BACKGROUND

The present invention relates to laser systems and in particular to a method of and apparatus for combining plural laser sources.

The investigation of, e.g., biological processes and functions using laser-based fluorescence instruments is becoming increasingly common. Such instruments measure and observe the fluorescence signals emitted when a target is, e.g., illuminated or excited by a laser source. Typical applications of these techniques include, but are not limited to, fluorescence imaging, scanning microscopy, confocal microscopy, total internal reflection fluorescence microscopy (TIRF), fluorescence correlation spectroscopy (FCS), flow cytometry, imaging cytometry, small animal or molecular imaging, high content screening and cellular imaging.

Laser-based fluorescence instruments typically require combinations of laser light of different wavelengths, e.g., in order to excite different fluorescent targets such as fluorescent probes and fluorescent proteins. The experiments and investigations carried out using these instruments can involve single or multiple combinations of fluorescent targets.

The increasing diversity and sophistication of applications for these instruments has led to an increasing demand for laser sources featuring as wide a range of wavelengths as possible, together with enhanced flexibility, control, repeatability, reliability and precision of the combined laser source.

To meet these demands, it is usually desirable that the laser sources used for excitation can be selected and controlled with a high degree of precision, and that, e.g., the desired intensity levels requested by a user can be maintained within very tight tolerances both for the duration of any given experiment, and over the longer term use of the instrument. These requirements can also extend to other key parameters of the laser system, such as pointing stability, polarisation stability and noise performance.

A number of laser systems have previously been proposed to try to meet these requirements.

One known type of such laser systems can be viewed as "free space" or "direct-coupled" laser systems. In these systems, light from plural laser sources is co-aligned into a "single" beam using combining mirrors, with the combined beam then being coupled directly (i.e. in free space) into the main instrument.

A difficulty with such direct-coupled systems is that it can be difficult to ensure precise co-alignment of the laser beams in free space, and to maintain that alignment over time.

It is known therefore to also use an optical fibre to couple the combined beam from the laser sources into the main instrument. In these arrangements, the laser beams are first combined in free space using, e.g., mirrors, but that beam is then coupled into an optical fibre which delivers it to the main target instrument. In this way, the free space travel of the combined laser beams (and hence the effect of any laser pointing or alignment errors) can be minimised. Such systems are commonly referred to as being "fibre-coupled".

In both direct-coupled and fibre-coupled systems it is necessary to provide some mechanism whereby, e.g., individual or selected laser lines from the plural laser sources can be selected for use in the instrument, and, e.g., the intensity of the beam input to the target instrument can be controlled.

One known way to provide such selection and control is to place appropriate filters in the path of the combined beam (or, indeed, in the paths of the individual beams from the individual laser sources). These filters could comprise, e.g., dielectric filters that can be placed in the beam path, or more sophisticated devices such as acoustic-optical tuneable filters (AOTFs).

However, the use of such filters does inevitably lead to transmission losses at the filter (which losses can be of the order of 20%). The laser switching speed of filter-based systems can also be relatively limited, as can their laser line blocking (filtering) performance, and the wavelength range over which they can be used.

Many laser-based fluorescence instruments use diode lasers. When the output intensity of a diode laser is reduced towards zero, a threshold point is reached where the diode laser switches from a lasing mode with predominantly stimulated emission, to a "light emitting diode" (LED) mode with incoherent light output generated by spontaneous emission. Just below this lasing threshold point, all the optical output power is emitted in the LED mode, and just above the lasing threshold point the desired laser mode starts to dominate and the LED mode emission narrows and reduces in level.

Any LED emission by a diode laser is undesirable in a fluorescence instrument, since it will interfere with the fluorescence measurements. For this reason, diode lasers are usually operated well above their threshold points in laser combining systems, so as to avoid any risk of LED emission. Filters are then used, as discussed above, to reduce and/or select the desired laser output.

SUMMARY

However, the Applicants have now found that if the output beam from a diode laser is passed through an optical fibre, then there will tend to be no LED-type emission present in the laser beam output from the fibre, even if such output may be present in the initial output beam of the diode laser. This is believed to be because the combination of the optical fibre and the optics for coupling the laser beam into the optical fibre acts as a filtering arrangement that in effect substantially excludes any LED emission from the diode laser in the wanted beam that is delivered by the optical fibre to the, e.g., target instrument.

Thus, according to a first aspect of the present invention, there is provided a laser source system for providing a laser output beam for delivery to a target, the system comprising:
  one or more diode lasers;
  means for controlling the output of the or each diode laser;
  an optical fibre or fibres for delivering the output beam or beams of the diode laser or lasers to a desired target; and
  means for coupling the output beam or beams of the diode laser or lasers into the optical fibre or fibres.

According to a second aspect of the present invention, there is provided a method of operating a laser source that comprises one or more diode lasers, the method comprising:
  controlling the output of the one or more diode lasers to provide one or more laser beams for delivery to a target;
  coupling the output laser beam or beams from the diode laser or lasers into one or more optical fibres; and
  providing the beam or beams output by the optical fibre or fibres for delivery to a target.

The laser system of the present invention has one or more diode laser sources whose outputs are directly controlled, with the laser beam or beams then being coupled into an optical fibre or fibres for delivery to a desired target (such as a fluorescence instrument, as discussed above).

As discussed above, the Applicants have recognised that if the output beams from diode laser sources are passed through an optical fibre before, e.g., delivery to the target instrument, then the optical fibre(s) will tend to eliminate any unwanted LED emission from the output beam. This means that, for example, the output from the diode lasers can be directly controlled and modulated, as in the present invention, even down to levels at which LED emission might or will occur, since any unwanted LED emission can in any event be prevented from reaching the target instrument.

The system of the present invention has a number of advantages.

For example, because the diode laser sources can and do have their outputs directly controlled, even down to levels where LED emissions might or will occur, there is no need also to include filters in the beam path, for example, for controlling the intensity of the beam(s) or selectively including the individual laser lines in the overall output of the system. The fact that such filters are no longer required in the present invention means that the present invention can, e.g., avoid the transmission losses caused by such filters and therefore extend the maximum laser power that is available to the, e.g., target instrument.

The present invention can also, e.g., and as will be discussed further below, provide significantly increased laser switching speeds as compared to existing systems.

The system of the present invention can include any desired number of diode laser sources. It preferably includes a plurality of (i.e. two or more), diode lasers, and most preferably comprises 2 to 8 diode lasers. Five or six diode lasers have been found to be useful numbers of diode lasers to include in system.

Each diode laser preferably has a different wavelength to the remaining diode lasers. In a preferred embodiment, the wavelengths of the diode lasers extend over the range of violet or ultra-violet to near-infra-red (NIR). Most preferably a wavelength range of 370 nm to 750 nm is provided. It should be noted here that the wavelength range that can be provided by and supported by the system of the present invention is limited only by the wavelength range that the optical fibre or fibres can accept. This should be contrasted with, e.g., prior AOTF-based systems, where the properties of the AOTF itself will typically limit the useable wavelength range. The present invention can thus provide an extended wavelength range.

The outputs of the diode laser or lasers (i.e. their intensity) can be controlled in any desired and suitable manner, for example using such techniques as are known and available in the art.

It should be noted here that in the present invention the output of the or each diode laser should be and is directly controlled, i.e. such that it is the output by the laser diode itself that is controlled. This should be contrasted with, e.g., prior art arrangements in which the output of the diode laser itself is set at a fixed level (e.g. by providing a fixed drive current for the laser diode) and then the desired "wanted" laser beam intensity achieved by modifying or modulating the output beam after it has left the diode laser, e.g. by using a filter to attenuate the output beam to achieve the desired beam intensity.

In a particularly preferred embodiment, the drive (input) current (i.e. the current passed through the laser diode) for the or each diode laser is varied, e.g., by appropriate (electronic) control means, to control the diode laser's output. Thus, in a preferred embodiment, the drive current through the or each laser diode can be and is varied. This provides a convenient way of directly controlling and modulating the output of each diode laser.

One or more and preferably each of the diode laser(s) can preferably have its output varied over a range of (intensity) settings. The laser diode or diodes could, e.g., be selectively variable in a stepwise or continuous manner throughout the allowed range. Most preferably the allowed range extends from zero effective laser output to the maximum output useable for the laser diode in question. Thus, in a preferred embodiment, the present invention includes means for or a step of varying the output of a or the or each diode laser, preferably continuously, over a range of output settings. This can be achieved, e.g., by varying the drive currents for the laser diodes in this manner.

In a particularly preferred embodiment, one or more and preferably each of the diode lasers is arranged to be selectively operable over a range of output intensity that extends over and includes the diode laser's (lasing) threshold point, i.e. such that as well as the diode laser being operable at "lasing" intensities, it can also be switched to an LED emission state.

The Applicants have recognised that in the arrangement of the present invention, rather than the LED emission state being problematic and undesirable, the effect of operating the diode laser in that state will simply be to exclude its output from the output beam delivered by the optical fibre(s) (since the optical fibre(s) will filter out the LED emission). Thus, switching a diode laser source to an LED emission state will have the effect of switching the diode laser "off", so far as the output beam is concerned (and without, e.g., the need to reduce its input current to zero).

The Applicants have further recognised that an effect of this is that if a diode laser in the system of the present invention is operated around its threshold point, then relatively small changes in the control signal (drive current) to the laser diode can be used to switch the diode laser "on" and "off" in the output beam. This all means that changes in intensity and the switching in or out of a given diode laser source in the output beam delivered by the optical fibre(s) in the arrangement of the present invention can be achieved by relatively small and accordingly relatively fast changes in the, e.g., control (drive) current of the diode laser. This facilitates faster switching of the intensity and presence or otherwise of the diode laser sources in the output beam than is achievable in known prior art systems. For example, the present invention can provide diode laser switching at nanosecond and sub-nanosecond rates, particularly where the diode lasers are operated around their lasing threshold points.

Thus, in a particularly preferred embodiment, a and preferably each diode laser can be and preferably is operated at and around its (lasing) threshold point. Most preferably one or more and preferably each diode laser can be selectively placed in a state where it or they are maintained at their threshold point.

In a particularly preferred such embodiment, the output intensity control for each diode laser is set or calibrated such that the intensity control setting for zero laser output (i.e. for the laser to be switched "off") corresponds to and coincides with the (lasing) threshold point of the laser diode of the diode laser. Most preferably, the system is arranged such that a and preferably each diode laser can be selectively set to this zero laser output state.

It is believed that operating a diode laser in this manner may be new and advantageous in its own right. Thus, according to a third aspect of the present invention, there is provided a laser source, comprising:

a diode laser;

means for coupling the output beam of the diode laser into an optical fibre or fibres; and means for selectively setting the diode laser to operate at its threshold point.

According to a fourth aspect of the present invention, there is provided a method of operating a diode laser, comprising:

coupling the output beam of the diode laser into an optical fibre or fibres; and selectively setting the diode laser to operate at its threshold point.

As will be appreciated by those skilled in the art, these aspects of the invention may include any one or more or all of the preferred and optional features of the invention described herein. Thus, for example, the system preferably further includes an optical fibre or fibres into which the output from the laser diode is coupled.

The fact that the present invention facilitates operating the diode lasers at and around their (lasing) thresholds also means that control of the output of the diode lasers themselves can be used to achieve very low output levels (instead of, e.g., having to use attenuating filters to achieve this). This further increases the dynamic output power range that can be provided.

In fact, the Applicants have found that with the arrangement of the present invention, essentially linear power control of each diode laser over its full power range (i.e. from its LED emission threshold to its maximum laser output power) can be achieved. This will typically provide a dynamic range of control of the order of 300:1.

The present invention thus provides a system that can, inter alia, maximise the available laser power, and extend the dynamic range of laser output available, but without compromising, inter alia, the laser switching speed (indeed, this may even be improved), or LED mode light leakage.

Each diode laser in the system is preferably operated in the above manner. This facilitates the straightforward inclusion or exclusion, etc., of any given diode laser in the output beam, as desired.

In a preferred embodiment, the control (drive) current to one or more and preferably each of the laser diode sources can be reduced to below the (lasing) threshold current. This may be useful to, e.g., reduce current dissipation and/or increase laser diode lifetime. In a preferred such arrangement, a diode laser that has been maintained at a lower, reduced current level is preferably moved to its threshold emission state when use of that diode laser is anticipated, so as to place the diode laser in a "ready" state.

The beam or beams output from the diode laser or diode lasers may be coupled into a single optical fibre, and/or into plural optical fibres, for delivery to the, e.g., target instrument. Plural optical fibres may, e.g., be desirable where the target instrument requires plural separate beam inputs, and/or would allow the same laser source system to be coupled to plural different targets (e.g. instruments).

In one preferred embodiment, all the diode laser sources are combined and coupled into a single optical fibre for delivery to the target. In another embodiment, different diode laser sources are coupled into different optical fibres, and a plurality of optical fibres are used to deliver the laser beams to the target.

Where plural fibres are used, each laser source could be coupled into a different fibre, and/or plural laser sources could be coupled into the same delivery fibre.

The exact arrangement of optical fibres that is used can and will, as will be appreciated by those skilled in the art, depend, e.g., on the architecture and requirements of the target instrument.

The optical fibre or fibres can comprise any suitable form of optical fibre, such as single-mode fibre(s) and/or multi-mode fibre(s). The fibre(s) can be of any desired construction, including, e.g., air-cored fibres and photonic crystal fibres (PCF). It would also be possible to use polarisation preserving (maintaining) fibres, and this may be desirable, e.g., where the target instrument includes polarisation sensitive components.

The output beam or beams from the diode laser source or sources can be coupled into the delivery optical fibre or fibres as desired. For example, conventional beam steering optics, such as mirror arrays, could be used for this purpose. Where laser beams from plural diode lasers are to be coupled into the same fibre, then suitable beam combining optics, such as a mirror array, should be used for this purpose, as is known in the art.

It is preferred for the beam combining and coupling arrangements to be as accurate and as stable as possible, as this enhances the accuracy and stability of the system. Known devices that achieve these aims can be used for this purpose.

In a preferred embodiment, an adjustable beam steering arrangement is provided for each individual laser beam, that can be used to direct the laser's beam appropriately into the beam combining arrangement (if any) and then into the optical fibre coupling arrangement. Providing such adjustable beam steering on an individual basis for each laser source allows better optimisation of the overall beam pointing and combining than can be achieved, e.g., with fixed beam combining systems.

Thus, in a preferred embodiment, the means for coupling the laser beam into the optical fibre will comprise an adjustable beam steering arrangement for each individual laser, which beam steering arrangements direct the lasers' output beams into a beam combining arrangement that aligns the lasers' beams into an aligned beam or beams which is or are then input into the optical fibre or fibres.

In a particularly preferred embodiment, the beam steering, combining and coupling arrangement uses beam pointing, manipulating and steering devices, and optical fibre connectors and couplers, of the type previously proposed by the Applicants, for example in their UK Patent Nos. 2325058, 2325057, 2375617 and 2396222, and in their UK Patent application No. 0514493.6. As discussed in the above patents and patent application, these devices help to ensure more accurate, reliable and repeatable beam steering, combining and coupling into an optical fibre or fibres, and therefore can be advantageously used in the system of the present invention.

As well as one or more diode lasers, as discussed above, the system of the present invention could also include one or more other lasers, such as HeNe lasers, diode-pumped solid state lasers, air-cooled or water cooled gas lasers, and/or fibre lasers. The output from these lasers can be controlled in any appropriate manner, and may, e.g., as is known in the art, require the use of suitable filters, such as AOTFs. (However, it should be noted that this will not and does not detract from the operation and advantages of the present invention discussed above, since the filter arrangement will only be needed and used for the laser or lasers in question, and need not and will not be used in relation to the diode lasers).

In such an arrangement, the output(s) from such further, non-diode laser(s) may be steered and coupled directly into the main beam combining and coupling optics of the system, or, e.g., if the non-diode laser is to be remotely or separately mounted, it could be coupled into (delivered to) the diode laser system beam combining optics via an optical fibre.

The beam or beams output from the optical fibre or fibres can be delivered and provided to the desired target in any suitable and desired manner. For example, a beam steering, shaping, focussing and/or collimating arrangement (optics) could be arranged at the output side of the fibre or fibres to direct the beam or beams appropriately to a or the target(s). Thus, in a preferred embodiment, the system and method of the present invention further comprises means for or a step of providing the beam or beams output by the optical fibre or fibres for delivery to a target.

In a preferred embodiment, the system of the present invention can provide plural output beams simultaneously. This would provide, e.g., plural separate inputs to a single instrument (for use, e.g., for target instruments and systems that require laterally or angularly separated illumination paths and/or that require (separate) chromatic correction), and/or allow the laser source system to be used with plural targets (e.g. instruments) simultaneously.

Such an arrangement could be achieved, e.g., by having plural delivery optical fibres, and by providing, e.g., a beam splitting arrangement for dividing, e.g., the combined laser beams between the delivery optical fibres, and/or by combining the laser beams from different laser sources into different fibres. Additionally or alternatively, a beam splitting arrangement could be provided on the output side of a delivery optical fibre or fibres, to provide post-delivery fibre separation of the laser beam into plural separate beams.

Thus, in a preferred embodiment, the present invention further comprises one or more beam separating or splitting arrangements, that can be used to provide plural output beams from a single input beam. As discussed above, these beam splitting arrangements could be arranged before or after the delivery optical fibre(s), as desired. They can be constructed in any desired and suitable manner, for example using light-separating dichroic mirrors.

Such beam separating arrangements can preferably be selectively actuated, e.g. by moving them into and out of the beam path, as desired.

In a preferred such arrangement, the system is arranged or arrangeable to deliver plural separate output beams, each comprising a different (selected) group of wavelengths.

In a particularly preferred such arrangement, the lasers of the system are grouped into plural different sets, preferably as wavelength sub-groups, with the output beams of each group or set of lasers being combined together into different delivery optical fibres, such that a separate optical fibre link is provided for each set of laser sources (e.g. wavelength sub-group).

Where two or more delivery (output) optical fibres are provided in the system, it is preferred if the output from a given laser can be selectively input to one or other or both (or all) of the delivery (output) optical fibres. This enhances the flexibility of the system, and facilitates, for example, its use with more complex instruments and/or more instruments, without the need for additional lasers or laser sub-systems.

Such selective directing of the individual lasers can be achieved as desired, for example by using appropriate beam steering and splitting arrangements, such as dichroic mirror arrays.

In a particularly preferred such arrangement, one or more than one and preferably each laser has a "fibre" selection device that can be selectively placed in the path of the beam from the laser to direct it to a desired delivery optical fibre or fibres. In such an arrangement, placing the selection device in the beam path could, e.g., direct the beam to one fibre, whereas omitting the selection device from the beam path could allow the beam to travel to a different delivery fibre. Preferably a plurality of the lasers, and preferably each laser, is provided with such a delivery fibre selection device.

Where such a fibre selection device or devices is provided, it is or they are preferably moveable into and out of the beam path in a linear fashion. This has the advantage that, particularly where the selection device uses mirrors to redirect the laser beam, a high degree of precision in the final position of the selection device when it is in the beam path is not essential for adequate performance.

As is known in the art, certain laser-types, such as high power lasers, can have detrimental effects on optical fibres and/or require the use of particular optical fibres. Where such a laser is used in the system of the present invention, it is preferred that a separate optical fibre is provided for delivery of that laser's output. Thus, in a preferred embodiment, one or more lasers of the system are directed through a different optical fibre to the remaining lasers.

In such an arrangement, it is preferred that the separated laser beams are, or can be selectively, combined into a single beam after they exit the delivery fibres, but before the output beam is input to the target, e.g., instrument (i.e. rather than being combined in the target instrument itself). Such beam combination can be achieved in any suitable and desired manner.

Thus, in a particularly preferred embodiment, the system of the present invention comprises two or more delivery optical fibres and means for, preferably selectively, combining the outputs of two or more of the delivery optical fibres into a single beam for delivery to a target.

The system of the present invention can be constructed and arranged in any desired and suitable manner. In a preferred embodiment, the diode lasers, beam steering and combining optics, and delivery optical fibre are arranged and mounted on or in a common, preferably integral, chassis and/or housing. This provides an integrated system that can, e.g., be arranged to be portable and/or rugged.

It is also preferred, as will be appreciated from the above, for there to be no filters placed in the beam paths from the diode lasers to the output side of the delivery optical fibre or fibres.

The present invention can be used whenever and wherever a diode laser source or sources is required. As will be appreciated by those skilled in the art, it will find particular, albeit not exclusive, application in arrangements of the type discussed above, such as for laser-based fluorescent instruments, microscopy applications, etc. In these cases, as will be appreciated by those skilled in the art, the target or targets that the laser beam or beams output from the optical fibre or fibres is to be delivered to will comprise an optical instrument, such as a microscope.

The present invention accordingly also extends to an optical instrument or optical system comprising the laser system of the present invention, to a method of operating an optical instrument or optical system that includes the methods of the present invention, and to the use of the system or methods of the present invention in or for or with an optical instrument or system. In a preferred such embodiment, the optical instrument or system comprises a microscope, laser-based fluorescence instrument, a fluorescence imaging instrument, a scanning microscope, a confocal microscope, a total internal reflection fluorescence microscope (TIRF), a fluorescence correlation spectroscope (FCS), a flow cytometry instrument, an imaging cytometry instrument, a small animal or molecular imaging instrument, and/or a high content screening and cellular imaging instrument.

As will be appreciated by those skilled in the art, all of the above aspects and embodiments of the invention can include any one or more or all of the preferred and optical features of the invention described herein, as appropriate.

The methods in accordance with the present invention may be implemented at least partially using software e.g. computer programs. It will thus be seen that when viewed from further aspects the present invention provides computer software specifically adapted to carry out the methods hereinabove described when installed on data processing means, and a computer program element comprising computer software code portions for performing the methods hereinabove described when the program element is run on data processing means. The invention also extends to a computer software carrier comprising such software which when used to operate a laser system or optical instrument or system comprising data processing means causes in conjunction with said data processing means said system or instrument to carry out the steps of the method of the present invention. Such a computer software carrier could be a physical storage medium such as a ROM chip, CD-ROM or disk, or could be a signal such as an electronic signal over wires, an optical signal or a radio signal such as to a satellite or the like.

It will further be appreciated that not all steps of the method of the invention need be carried out by computer software and thus from a further broad aspect the present invention provides computer software and such software installed on a computer software carrier for carrying out at least one of the steps of the methods set out hereinabove.

The present invention may accordingly suitably be embodied as a computer program product for use with a computer system. Such an implementation may comprise a series of computer readable instructions either fixed on a tangible medium, such as a computer readable medium, for example, diskette, CD ROM, ROM, or hard disk, or transmittable to a computer system, via a modem or other interface device, over either a tangible medium, including but not limited to optical or analogue communications lines, or intangibly using wireless techniques, including but not limited to microwave, infrared or other transmission techniques. The series of computer readable instructions embodies all or part of the functionality previously described herein.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, for example, shrink-wrapped software, pre-loaded with a computer system, for example, on a system ROM or fixed disk, or distributed from a server or electronic bulletin board over a network, for example, the Internet or World Wide Web.

BRIEF DESCRIPTION OF THE DRAWINGS

A number of preferred embodiments of the present invention will now be described by way of example only and with reference to the accompanying drawings, in which.

DETAILED DESCRIPTION

Like or similar reference numerals are used for like and similar components throughout the drawings.

Figure 1:
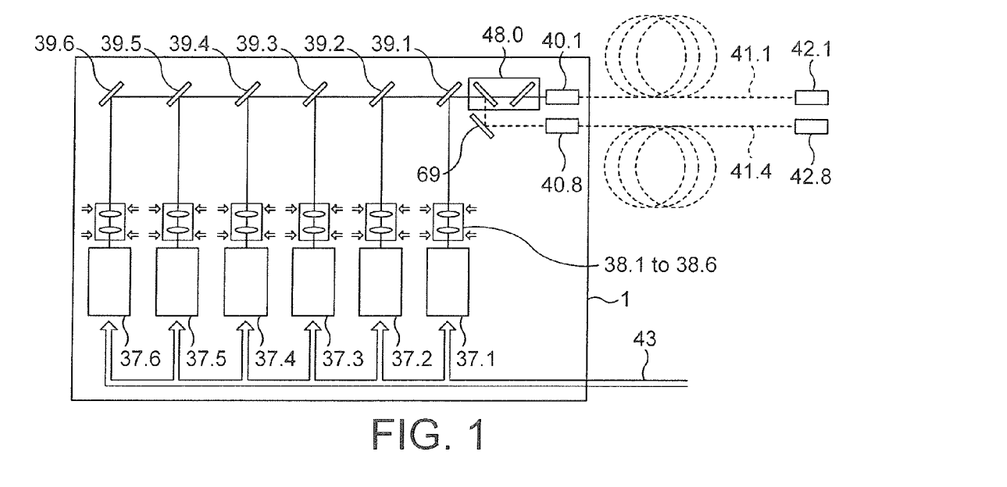
FIG. 1 shows a first embodiment of a laser system that is in accordance with the present invention.

FIG. 1 shows a first embodiment of a laser system that is in accordance with the present invention. In this embodiment, a combination of diode lasers (e.g., one or more diode lasers) form a compact laser sub-system which can deliver a laser beam via an optical fibre to, e.g., a target optical instrument.

As shown in FIG. 1, the laser system 1 comprises six solid state diode laser modules 37.1 to 37.6 mounted on a stable optical chassis. The laser modules are mounted such that the polarisation axes of the lasers are vertical with respect to the system chassis.

The output beams of the lasers are directly coupled into beam steering devices 38.1 to 38.6 and thereby routed to laser combining dichroic mirrors 39.1 to 39.6, which combine the individual laser beams into a single, co-aligned beam. (As will be appreciated by those skilled in the art, other suitable combining means such as prisms or grating devices could be used, if desired.)

The combined laser beam is directed into an optical fibre 41.1 for delivery to a target, e.g. an optical instrument such as a microscope. The optical fibre 41.1 is provided with input coupling optics 40.1 for this purpose. The delivery optical fibre 41.1 is then coupled to the target instrument via fibre output collimating optics 42.1. These input and output optical arrangements can take any suitable form.

The beam steering devices 38.1 to 38.6 and beam combining devices 39.1 to 39.6 are arranged so as to be as stable and stress-free as possible, so as to try to ensure stability and minimum depolarisation of the laser beams in use. The laser combining devices 39.1 to 39.6 are mounted in fixed, non-adjustable mounts for this purpose. These mounting requirements can be achieved in any appropriate manner. In a preferred embodiment, kinematic mounting techniques are used.

The beam steering devices 38.1 to 38.6 are adjusted to make all the laser output beams collinear on the axis of the fibre input coupling optics 40.1. Alternative arrangements, for example, where the co-alignment of the beams is achieved by dichroic mirrors mounted in adjustable trimmed devices adjusted in conjunction with the beam steering devices could be used instead.

The compact nature of this beam steering and combining arrangement ensures that all optical paths are kept to a minimum to maximise stability of the laser coupling. The adjustment of beam steering devices 38.1 to 38.6 to achieve a combined collinear beam provides the ability to optimise the adjustment for each individual laser, thereby facilitating obtaining the maximum available laser power for each of the lasers 37.1 to 37.6, thus maximising the dynamic range, and helps to optimise the coupling into the optical fibre.

To improve the beam quality of the diode lasers, circularisation optics could be provided on a per laser basis as part of each individual diode laser module or a single such arrangement could be provided after the beam combination means. Likewise, collimation optics can be provided as part of each diode laser module or positioned at a convenient point within the beam path.

In a particularly preferred embodiment, the beam steering devices and optical fibre input and output coupling arrangements take the form of manipulators, optical fibre connectors and couplers, and beam steering devices, as described, e.g., in the Applicants' earlier UK Patent Nos. 2325058, 2325057, 2375617 and 2396222, and UK Patent Application No. 0514493.6.

The optical fibre 41.1 can comprise any suitable form of fibre, such as a single mode or multimode fibre. It can also be, for example, an air-cored or photonic crystal fibre.

If the target instrument requires a polarised input beam (for example if it contains polarisation sensitive components), then a (single mode) polarisation preserving fibre can be used. In this case, the polarisation axis of the fibre is preferably adjusted to be vertical to the base of the laser sub-system 1 such that all the lasers will be coupled optimally for stable polarisation. Matching of the polarisation axis of the lasers in the system to the polarisation axis of a single mode polarisation preserving fibre will result in a combined laser output with a highly stable polarisation state, thereby helping to ensure that the transmission through the polarisation dependant optical path(s) of the target instrument(s) will be predictable and insensitive to temperature fluctuations.

The output of each of the lasers 37.1 to 37.6 is controlled via an electrical interface 43 which can be coupled to the target instrument to allow the target instrument full control of laser selection, intensity control, and switching between any selected power levels for each of the lasers in the system. The lasers are controlled by direct modulation of their control (drive) currents to set and select the desired intensity level of each diode laser in use.

Each individual diode laser module is provided with a closed loop control system to ensure that the laser output intensity is maintained at the desired level selected by the user and set via the modulation control input for each laser.

The operation of the laser system of the present embodiment, and the principles behind it, will now be described in more detail with reference to FIGS. 2, 3, and 4.

Figure 2:
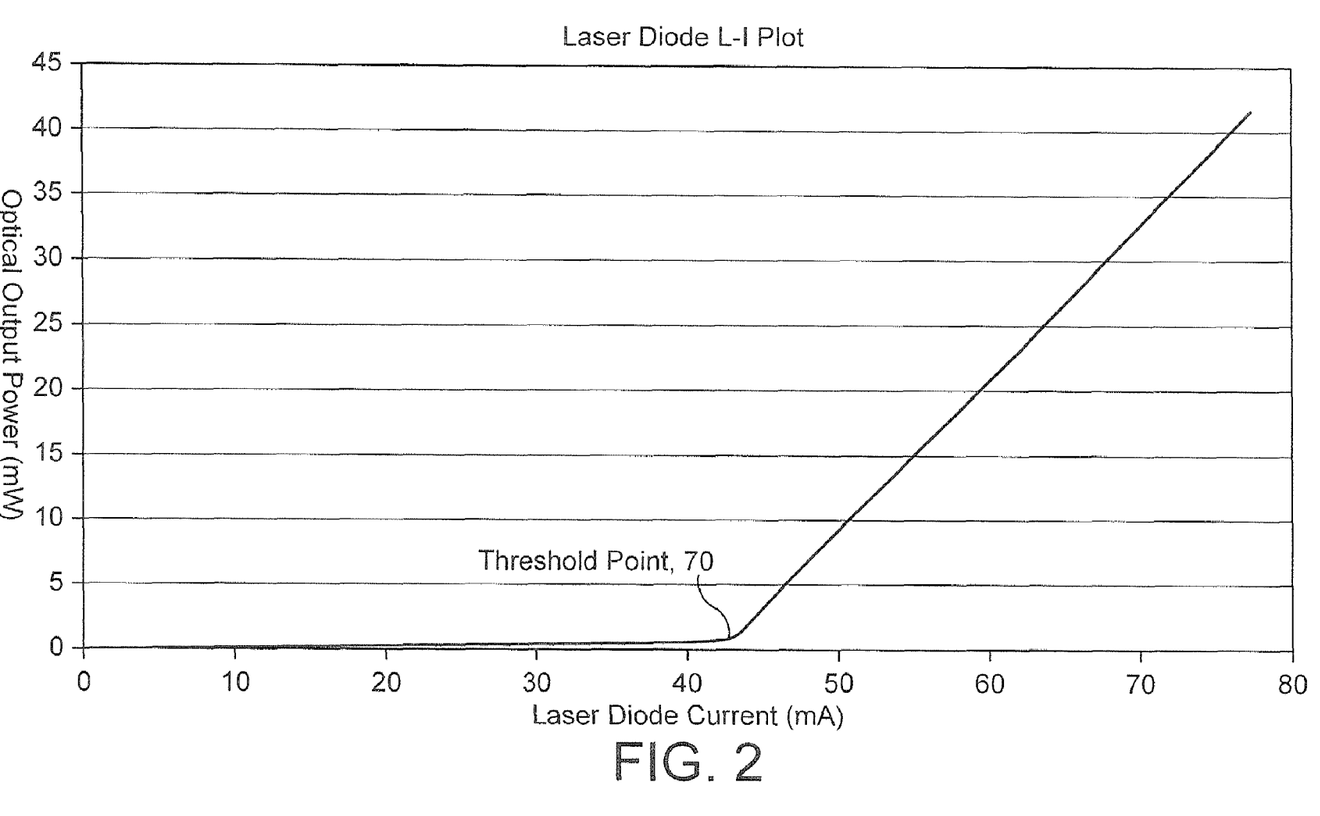
FIG. 2 shows the L-I curve for a diode laser showing the relationship between the diode laser current and the optical output power.

FIG. 2 shows the L-I (optical output power to laser diode current) curve for a diode laser of the type used in the present embodiment. This Figure shows a plot of diode laser current versus optical output power.

As shown in FIG. 2, as the diode current is reduced towards zero, a threshold point 70 is reached where the diode laser switches from a lasing mode with predominantly stimulated emission to an LED mode with incoherent light output generated by spontaneous emission. Just below this threshold point all the optical output power is emitted in the LED mode covering a spectrum of typically 20 to 50 nm. Just above the threshold point 70 the desired laser mode starts to dominate and the LED mode emission narrows and reduces in level. As discussed above, it is undesirable for any LED mode emission to be delivered to the target instrument in use.

Figure 3A:
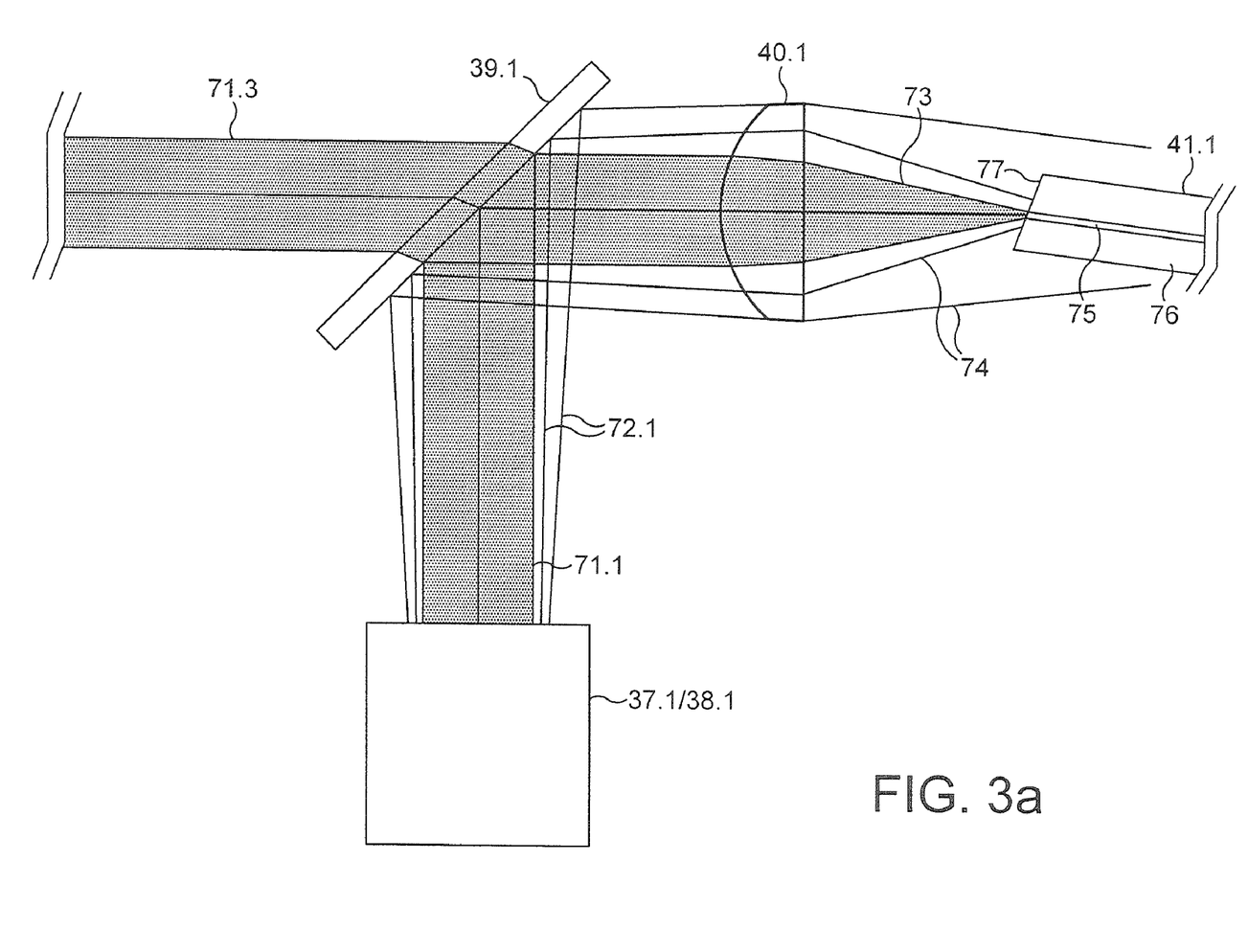
FIG. 3A shows how the optical arrangement of the invention effectively filters out the LED mode emission from a diode laser and preferentially transmits the desired laser mode.

FIG. 3A shows an enlarged schematic view of the optical arrangement of the present embodiment. For convenience and clarity only one of the lasers is shown in detail, but this is adequate to fully describe the principle of the arrangement.

As shown in FIG. 3A, the optical output from a first diode laser module 37.1 in the combination passes through the beam steering arrangement 38.1 and comprises a collimated laser emission 71.1 and a less directional 'LED type' emission 72.1 that extends over a broader spatial spread than the more spatially coherent laser emission 71.1. FIG. 3A also shows the combined collimated laser emission 71.3 output from the remaining lasers in the system. (There will also be a less directional 'LED type' emission from the other lasers. This has been omitted from FIG. 3A for clarity.)

The combined, collimated laser emission is focussed, as discussed above, by input coupling optics 40.1 into a beam 73 such that the focus of this beam matches the mode diameter of the delivery optical fibre 41.1, whereby the laser emission is efficiently coupled into the fibre core 75. (The face of the fibre 77 is angle-polished such that any back reflections from the fibre face will not be conducted back into the lasers. This avoids any interference with the individual lasers' closed loop laser power control circuits (which could otherwise upset the lasers' stability).)

As shown in FIG. 3A, a portion of the 'LED type' emission from the lasers will pass through the input coupling optics 40.1. However, as shown, because of the greater spatial divergence of these beams 74, they do not reach a suitable focus for effective coupling into the fibre core. Furthermore, any light of the 'LED type' that is scattered into the cladding 76 of the fibre 41.1 will be highly attenuated as it propagates along the fibre and thereby similarly effectively excluded from the output beam delivered to the target instrument.

In this way, the combination of the optical fibre 41.1 and its input coupling optics 40.1, effectively filters any unwanted LED-type emissions from the beam that is delivered to the target instrument, even if such emissions are present in the combined beam that is initially delivered to the optical fibre system.

In other words, the optical arrangement of the embodiment effectively filters out the LED mode emission from the plurality of diode lasers in the laser combining system and preferentially transmits the desired laser mode at the delivery optical fibre's output.

Figure 3B:
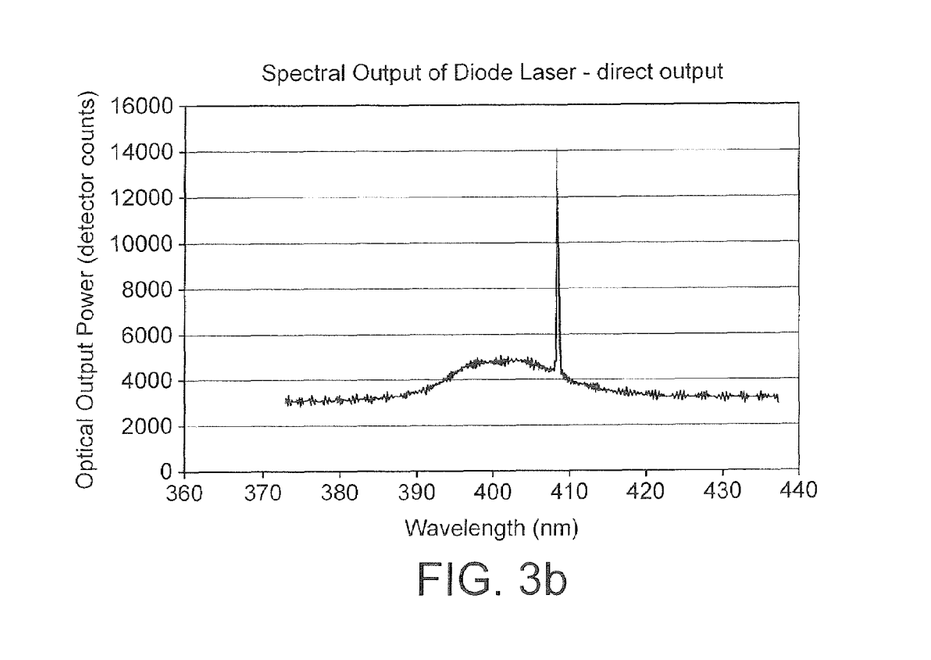
FIG. 3B shows a plot of the spectral output of a diode laser at the output of the diode laser.
Figure 3C:
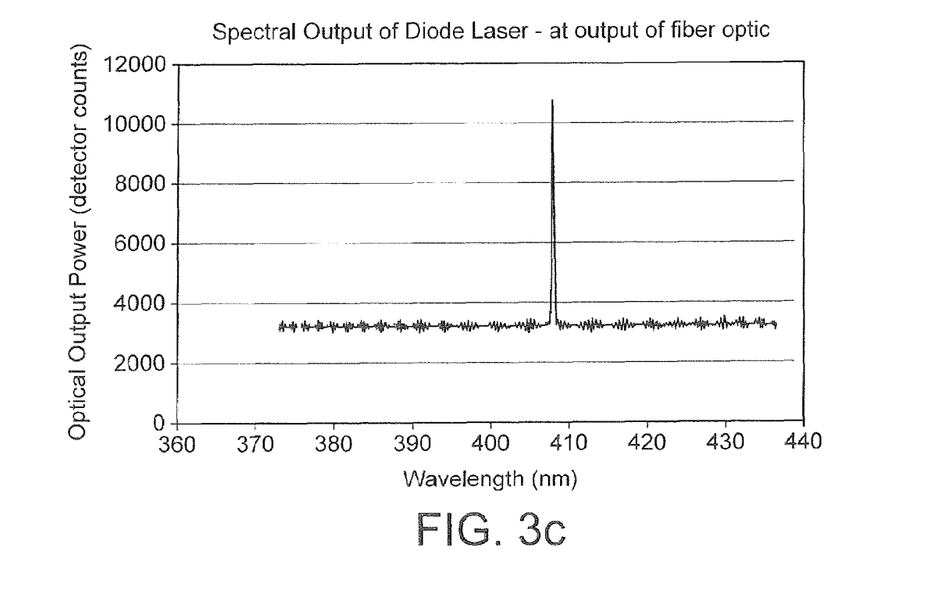
FIG. 3C shows a plot of the spectral output of the same diode laser as in FIG. 3B maintained at the same total optical output power after coupling though a fibre in accordance with the present invention and measured at the output of the optical fibre.

FIGS. 3B and 3C illustrate experimental data confirming this.

FIG. 3B shows a plot of the spectral output of a diode laser having a desired laser output at a wavelength of 408 nm, together with a residual level of LED mode emission extending from approximately 385nm to 425nm.

FIG. 3C shows a plot of the spectral output of the same diode laser maintained at the same total optical output power after coupling though a fibre in the arrangement of the present embodiment and measured at the output of the optical fibre.

As can be seen from FIG. 3C, after transmission through the optical fibre, the power level of the desired laser output at 408 nm has been attenuated by 27% (in line with expectations for fibre coupling losses).

However, more significantly, as shown in FIG. 3C, the LED mode is no longer detectable in the output beam (which therefore meets the typical laser blocking requirement of optical density >OD7 (i.e. the ratio of input laser power to unwanted laser output power is >107) required by typical target optical instruments in the field of the present invention).

This means, for example, that a laser that is not to be used in any given experiment will not introduce any light leakage that would be in the collection or pass band for the fluorescence signal excited by one of the other lasers in the system.

The data shown in FIG. 3C was obtained using a single mode optical fibre. However, the same principles and effects apply for other forms of optical fibre.

The intensity control for each diode laser in the system of FIG. 1 is calibrated such that the lasing threshold point of the diode laser coincides with the setting for zero laser output as measured at the fibre output for that diode laser. This allows for essentially linear power control of the diode laser over the full laser power range available from the lasing threshold to maximum laser output power, thereby providing, for example, a dynamic range of control of 300:1.

The laser diodes are, in use, maintained at this "zero output" point when their outputs are not required. This facilitates faster switching to an intermediate power level at ns and sub-ns rates.

In this embodiment, the diode laser current of each diode laser can be reduced below the threshold current, if desired, for example to reduce dissipation or increase diode laser lifetime. This will, in effect, place the diode laser in a 'standby' mode, where the diode laser can, e.g., be maintained at minimum current when not required by the instrument. It is preferred in this arrangement for the diode laser current to be increased to the 'zero output' threshold point just prior to the period when use (and in particular rapid switching) of the diode laser is required.

FIG. 1 also shows the use of a beam splitting or switching device 48.0 (which can be a fixed or selectable component) and beam steering means 69 for selectively directing the output beam to a second, additional output fibre optic link 41.4.

This arrangement allows the output of the laser combining system to be shared either sequentially or simultaneously by more than one instrument, without the need to move the laser combining system. A plurality of such beam splitting or switching devices could be employed together with a plurality of output fibres to further extend the flexibility of the arrangement.

Figure 4:
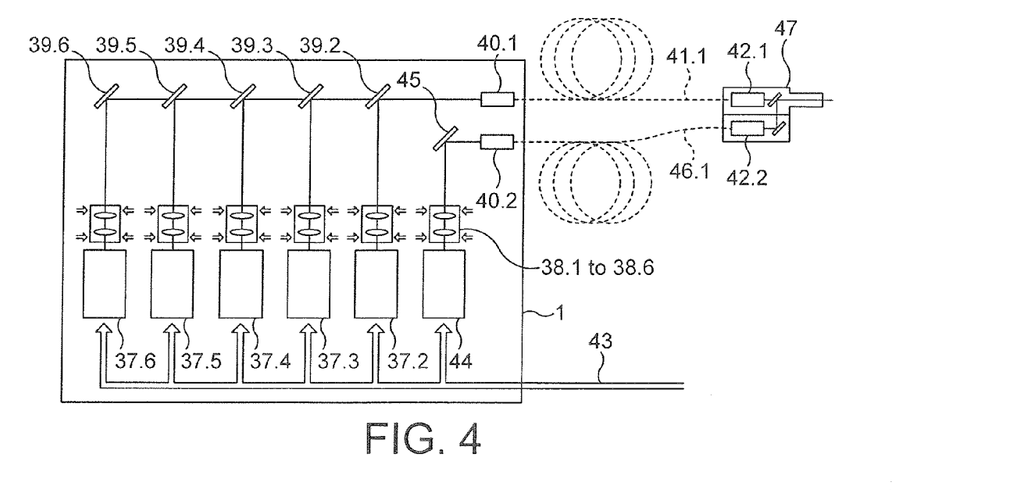
FIG. 4 shows a second embodiment of the present invention that demonstrates the integration of an additional laser requiring a specific fibre type for effective transmission and a method of post-fibre combination.

FIG. 4 shows a second embodiment of the present invention that demonstrates the integration of an additional laser requiring a specific fibre type for effective transmission and a method of post-fibre combination.

Some applications in the field of the invention may require a laser type which will not operate effectively with or may degrade the main output delivery fibre 41.1, such as, for example, UV and IR laser wavelengths, and/or very high power lasers. In this case, it would be undesirable to transmit the beam from such a laser through the same delivery optical fibre as is used for the remaining diode lasers.

FIG. 4 shows an embodiment of the present invention that avoids this.

As shown in FIG. 4, the output beam of an, e.g. high power, laser 44 of the laser system is routed via a beam steering device 38.1, steering mirror 45 and coupling optics 40.2 into a separate optical fibre 46.1 for transmission of the laser 44. The fibre 46.1 could, e.g., be specifically designed for lasers of the type of laser 44.

In this embodiment, as shown in FIG. 4, the fibre output collimating optics 42.2 for the laser 44 are located in a fibre output beam combining device 47 along with the output collimating optics 42.1 for the main delivery output fibre 41.1. The fibre output beam combining device 47 is a factory set precision device that that ensures that the output beams from the two fibres are collinear at the input to the target instrument. In this way, the beams are combined externally to the target instrument.

The dimensions of the output coupling of the fibre output beam combining device 47 can be conveniently arranged to be the same as the dimensions of the fibre output collimating optics 42.1 and 42.2, so that the user or manufacturer of the target instrument can interchange or upgrade systems easily.

In all other regards, the system as described with reference to FIG. 4 will operate identically to the system described above with reference to FIG. 1.

Figure 5A:
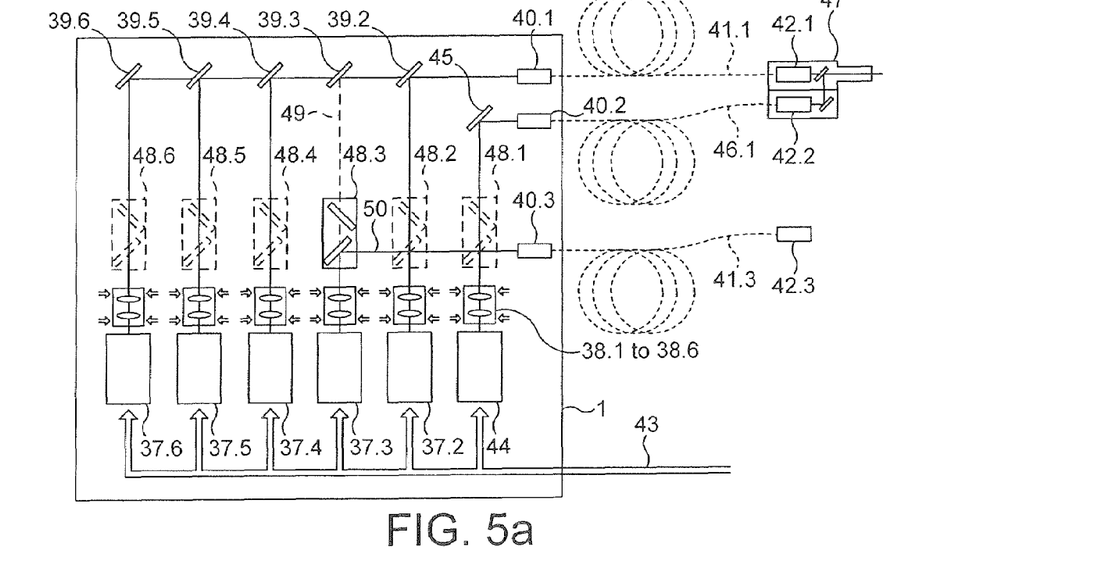
FIG. 5A shows a third embodiment of the present invention that uses a selection device together with an additional fibre optic output to support experiments requiring a second independent laser light stimulation source.
Figure 5B:
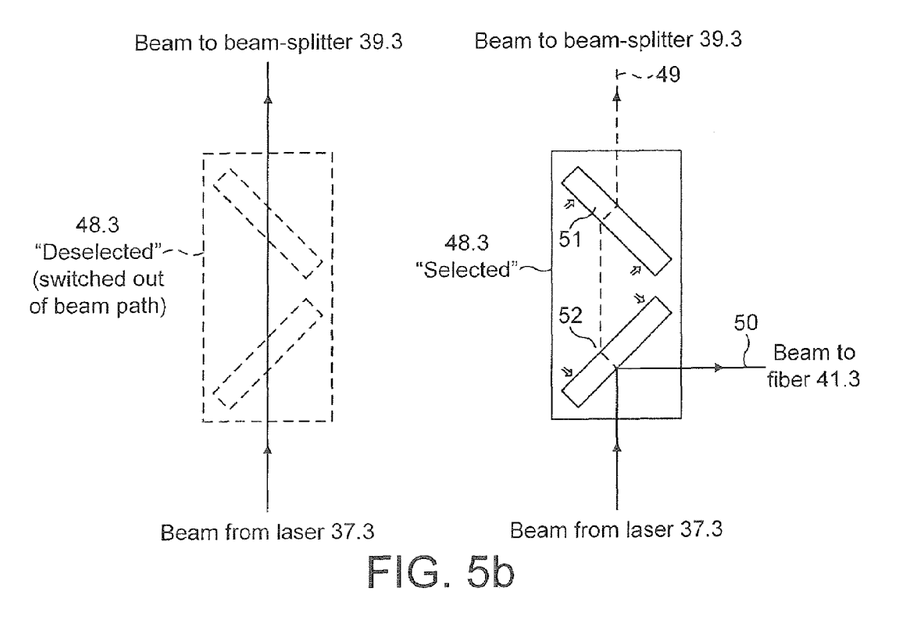
FIG. 5B shows in more detail how the selection device in the embodiment of FIG. 5A can be implemented.

FIGS. 5A and 5B shows a third embodiment of the present invention that uses a selection device together with an additional fibre optic output to support experiments requiring a second independent laser light stimulation source.

There are several applications in this art, such as FRAP, FLIP, photo-activation and photo-conversion, where it is desirable to stimulate an area of the specimen with a particular laser wavelength at a particular intensity followed by subsequent illumination with a possibly different wavelength at a possibly different power level. It is also desirable in such arrangements to reduce the time interval between the stimulation phase and subsequent illumination. This has led to the introduction of systems featuring duplicate illumination paths to allow essentially simultaneous stimulation and illumination.

FIG. 5A shows an arrangement in accordance with the present invention that provides duplicate illumination paths for such systems.

This embodiment has all the same features and benefits of the first and second embodiments described above, together with the following additional features.

As shown in FIG. 5A, the system of this embodiment includes, in addition to the main output optical fibre 41.1, and a second output optical fibre 46.1 dedicated to the laser 44, a secondary output optical fibre 41.3 that can be used, e.g., to provide a laser output to a secondary laser stimulation light path of the target instrument.

As shown in FIG. 5A, each of the laser beam paths is fitted with a selection device 48.1 to 48.6 for the secondary fibre output, which can be used to direct all or some of the laser output to the secondary fibre output 41.3. These selection devices are located immediately below or above the existing beam path and mounted on a linear slide such that the selection device is introduced into the beam path by a vertical movement. Of course, any other method of beam selection could be used.

The fibre input coupling optics 40.3 of the secondary delivery optical fibre 40.3 features 4-axis adjustment (not shown), to maximise the coupling of the collective beams 50 that can be selected in turn by selection devices 48.1 to 48.6.

In FIG. 5A the selection device 48.3 for the laser module 37.3 is shown by way of an example in the engaged or selected position. The laser beam from laser 37.3 is now split into two paths.

The first beam path 50, is the path of the beam selected by the selection device 48.3 (which can, e.g., be a higher portion of the laser power available from laser 37.3), and is routed to fibre input coupling optics 40.3 and then via a separate, secondary optical fibre 41.3 and fibre output collimating optics 42.3, into, e.g., a secondary laser stimulation light path of the target instrument.

The second beam path 49, is the path of the proportion of the laser beam transmitted through the selection device 48.3 (which can, e.g., be a lower portion of the laser power available from laser 37.3 suitable for regular illumination). This beam follows the original beam path to main delivery fibre 41.1 (as described above).

FIG. 5B shows an enlarged view of an exemplary selection device 48 of this preferred embodiment. The first view shows the selection device 48.3 in the disengaged or deselected position where there is no effect on the associated laser beam path 37.3. The second view shows the device in the selected position interrupting the beam path from laser 37.3.

As shown in FIG. 5B, the (each) selection device comprises a selection mirror or beam-splitter 52 and a "compensating" window 51.

The selection mirror or beam-splitter 52 may, e.g., be a partially reflective beam-splitter, a dichroic wavelength selective beam-splitter, or a fully reflective mirror, e.g., as required by the configuration of the laser system and the applications of the target instrument. The selection mirror or beam-splitter 52 is adjustable by translation and tilting such that the beam path 50 can be made collinear with the equivalent beam paths that can be obtained by engagement or selection of the other selection devices 48 for the other laser modules.

The compensating window 51 is of similar thickness to the selection mirror or beam-splitter 52, and is arranged to correct for the shift in the beam path caused by the selection mirror or beam-splitter 52. The compensating window 51 can also be adjusted to refract the beam path 49 to adequately recreate the original beam path that existed prior to the introduction of the selection device 48.

As discussed above, this embodiment uses linear movement to engage the selection device 48. This has the advantage that a very high degree of precision in the final position of the selection device 48 is not necessary, as the reflective surface of the selection mirror or beam-splitter 52 is in the same plane as the axis of movement of the selection device. Furthermore, any small residual positioning errors will result in a small variation of coupling efficiency of the stimulation beam only (for which, as is known in the art, less stringent accuracy is typically required in any event).

The arrangement of this embodiment thus provides a high degree of flexibility in terms of the selection and control of wavelengths used for stimulation and illumination, but without, e.g., the cost and complexity of providing additional lasers or laser sub-systems.

Figure 6:
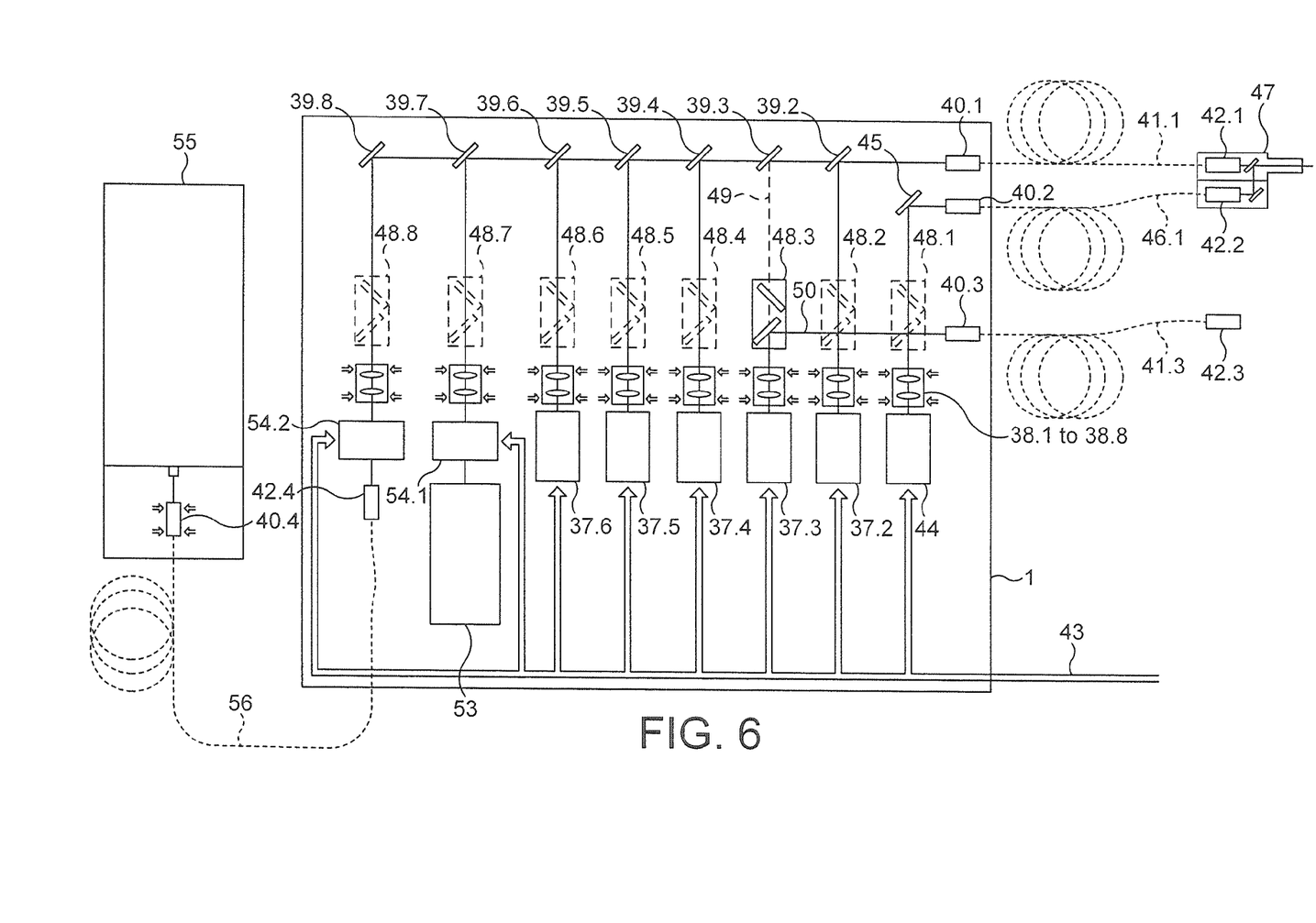
FIG. 6 shows a fourth embodiment of the present invention that includes the integration of laser light sources not capable of direct modulation.

FIG. 6 shows a fourth embodiment of the present invention. In this embodiment, a laser light source that is not capable of direct modulation is integrated into the laser combining system.

Diode laser modules typically cover the wavelength range from violet/UV (ultra-violet) up to NIR (near-infra-red). However, target instruments can require the use of a laser not capable of direct modulation. In this case, the configuration shown in FIG. 6 can be used to integrate such lasers into the laser combining system 1.

In FIG. 6, an additional compact laser 53, such as a diode-pumped solid-state laser, or a HeNe laser, is mounted within a slightly enlarged laser sub-system 1. To select and control this laser, a beam control device 54.1, such as an AOM (Acousto-Optical Modulator), an LCM (Liquid Crystal Modulator), or an AOTF, is positioned in front of the laser. This beam control device 54.1 is controlled via modulation control signal path 43. This arrangement again uses a beam steering device 38.7 and selection device 48.7 for laser stimulation applications.

It should be noted here that the use of the additional beam control device 54.1 in this way does not detract from the benefits of the present invention, as this device is only mounted in the individual beam path of the associated laser 53 and therefore can not compromise the control or leakage of the other laser wavelengths available in the laser sub-system of the present embodiment.

FIG. 6 also shows the addition of a larger frame laser, such as an air cooled or water cooled gas laser or a fibre laser, to the system. In this case, the laser 55 is remotely mounted and its laser beam introduced into the laser sub-system 1 via an optical fibre 56 (and suitable input coupling optics 40.4 and output coupling optics 42.4 for the fibre 56).

The laser beam from the laser 55 is again selected and controlled by a beam control device 54.1, e.g. of the same or similar type to that described above in relation to the laser 53.

Figure 7:
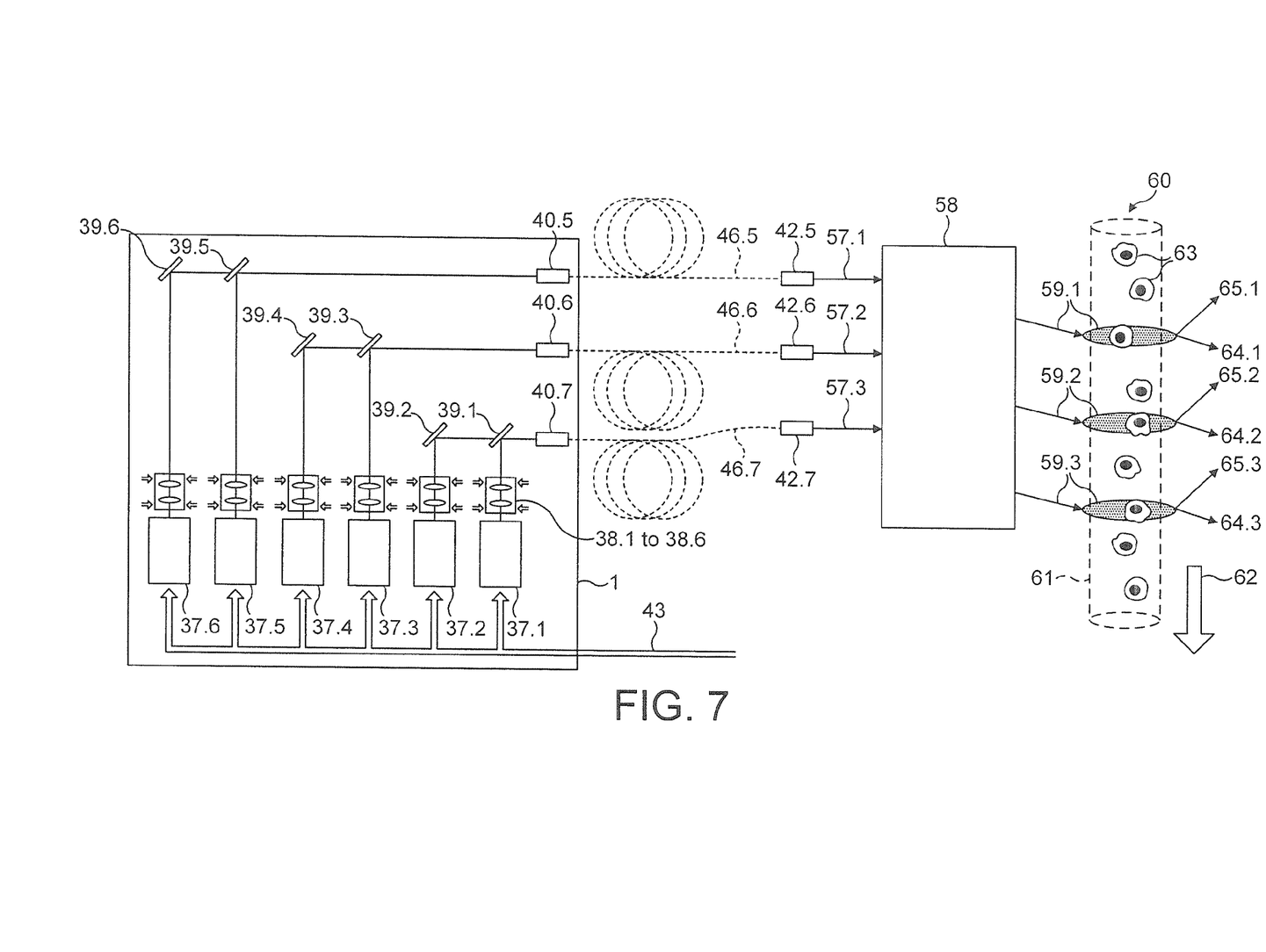
FIG. 7 shows a fifth embodiment of the present invention that groups lasers into separate wavelength sub-groups for subsequent delivery via a plurality of fibres.

FIG. 7 shows a fifth embodiment of the present invention. In this embodiment the individual lasers are grouped into separate wavelength sub-groups for subsequent delivery via a plurality of separate fibres (one for each sub-group). This arrangement may be desirable for instruments that require illumination systems with laterally or angularly separated illumination paths or for systems requiring separate chromatic correction for different wavelengths in the illumination path.

As shown in FIG. 7, the lasers are combined into subgroups prior to coupling into the main optical train 58 of the instrument. Each of these subgroups covers a restricted range of laser wavelengths as employed in the applications of the target instrument, such that in combination the subgroups cover the full range of wavelengths required by the instrument. In a typical application it is anticipated that one laser in each sub-group will be selected for any given application and used either singly or in combination with individual lasers or laser wavelengths from the other sub-groups.

Lasers 37.1 and 37.2 form one sub-group and are combined via mirrors 39.1 and 39.2 and then coupled via fibre input coupling optics 40.7 into fibre 46.7 which can be optimised for a wavelength band or range that includes the wavelengths of lasers 37.1 and 37.2.

Similarly, lasers 37.3 and 37.4 are combined to form another sub-group and coupled into fibre 46.6 which can be optimised for a wavelength band or range that includes the wavelengths of lasers 37.3 and 37.4. Likewise, lasers 37.5 and 37.6 are combined and coupled into fibre 46.5 which can be optimised for a wavelength band or range that includes the wavelengths of lasers 37.5 and 37.6.

Further lasers could be added into each wavelength band either by internally mounting additional lasers inside the laser sub-system 1 or by externally mounting lasers and fibre coupling them into the laser sub-system (e.g. in the manner shown in FIG. 6). The number of laser sub-groups is preferably restricted to the three groups shown in FIG. 7, although this is not essential.

The outputs of the three separate sub-group delivery fibres 46.5, 46.6 and 46.7 are collimated by output optics 42.5 to 42.7 and coupled into the optical train 58 of the target instrument as separate laser wavelength sub-groups 57.1 to 57.3. (As is known in the art, the optical train 58 of the instrument will typically include any necessary beam shaping, beam steering, alignment prisms and compensation optics for appropriately conditioning the laser beams and delivering them to the instrument's specimen volume.)

FIG. 7 shows by way of example an instrument with multiple illumination points in which the conditioned beams 59.1 to 59.3 are steered onto the specimen volume, and the signals of interest 64.1 to 64.3 and 65.1 to 65.3 are detected by suitable means. In FIG. 7, the specimen volume 60 comprises a flow stream 61 in which the specimen cells or particles 63 are preferentially maintained, with a direction of flow 62. The specimen cells or particles 63 flow in turn through the analysis points for each of the illumination beams 59.1 to 59.3 (which as shown are typically of elliptical cross section).

This embodiment provides a convenient solution for instruments where separate paths are required for different laser wavelengths. Examples of such instruments are flow cytometers (which typically in the case of multi-wavelength systems will feature multiple illumination points in the sample such that each illumination point acts as a separate analysis point within the specimen volume), and instruments where the wide range of laser wavelengths used by the instrument requires separate chromatic correction for each of the laser sub-groups to compensate for any chromatic dependency within the optics train of the instrument or specimen or specimen support structure.

Figure 8:
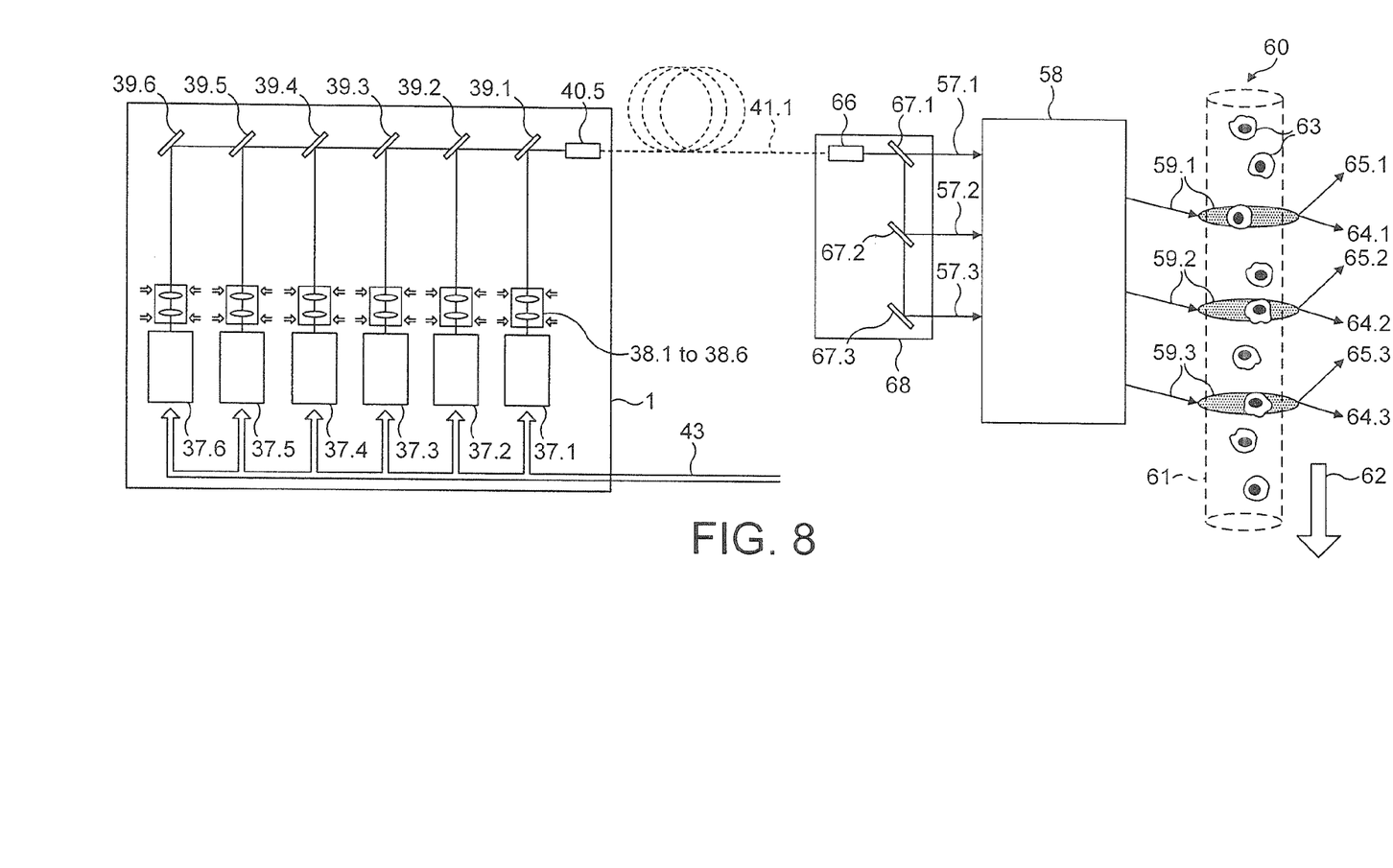
FIG. 8 shows a sixth embodiment of the present invention that features a post-fibre separation device.

FIG. 8 shows a sixth embodiment of the present invention that features a post-delivery fibre separation device. This arrangement can again be used, in particular, for instruments that require illumination systems with laterally or angularly separated illumination paths or for systems requiring separate chromatic correction.

In this embodiment, the outputs of lasers 37.1 to 32.6 are combined and coupled into a single delivery fibre optic 41.1, as in, for example, the first embodiment of the invention described above.

However, the output of the fibre 41.1 is connected to a laser light separating unit 68 which has suitable means for separating the output laser light into a plurality of distinct laser wavelength sub-groups. To do this, the laser light separating unit 68 includes beam collimating and shaping optics 66, and three light separating dichroic mirrors 67.1 to 67.3 (or other suitable means) for splitting the light into the desired wavelength sub-groups.

The so-separated laser light then enters the optical train 58 of the target instrument as separate laser wavelength sub-groups 57.1 to 57.3. This arrangement has the advantage that only one set of beam shaping and collimating optics is required to provide the plural separate beam paths. It also further supports the use of the laser combining sub-system as a shared laser resource for multiple instruments.

The laser light separating unit 68 is preferably implemented as a non-adjustable monolithic device, as this simplifies the alignment of the system and simplifies the requirements of the instrument optical train 58.

As will be appreciated by those skilled in the art, each of the above described embodiments of the invention can include one or more or all of the features of the remaining embodiments, as appropriate.

Furthermore, there are, of course, many ways of implementing the apparatus described above, and the present invention is not restricted to the range of applications and target instruments described, but is, as will be appreciated by those skilled in the art, equally applicable, e.g., to any other application or instrument where the combined delivery of laser beams from plural diode lasers is required or desired.

It can be seen from the above that the present invention, in its preferred embodiments at least, provides a combining system for a plurality of lasers of differing wavelengths that can provide an increased effective dynamic range, wavelength range, contrast, switching speed, accuracy and repeatability of measurements. This provides an improved laser light excitation source suitable, e.g., for quantitative fluorescence applications.

This is achieved in particular by using a combination of directly modulated diode laser modules that are collectively coupled into an optical fibre or fibres for delivery to a target instrument.

This arrangement has the effect that any "LED type" emission from any of the diode lasers in the combination is effectively filtered out of the output beam delivered to the target, and means that a controllable, integrated combined laser source can be provided without the need to use, for example, filters or AOTF-based laser control and selection devices. Furthermore, the laser diodes can be maintained in an "on" state even when their lasing output is not required, thereby facilitating faster switching and control of the lasers' output.

The present invention can thus, e.g., provide a laser light source providing multiple wavelengths with a means for precise control at ns and sub-ns switching speeds, of any selected combinations of the available wavelengths, and which is free from any interference from unselected wavelengths and where the, e.g., fluorescence signal intensities associated with the laser intensities can demonstrate a high degree of stability and repeatability over the timescales of typical experiments and investigations and also over intervening periods (such that experiments or investigations can be repeated with confidence that the instrument will provide consistent quantified results).

The present invention can also provide reduced cost and complexity combined laser light sources, since it can, e.g., avoid the use of attenuation devices, and remove the requirement for compensation means for laser instability.

The combined laser source of the present invention can also be both portable and rugged, and can, e.g., be attached to, and shared by, a number of different instruments within a user's facility, thereby, e.g., reducing the overall cost of instrumentation to the customer.

We claim:

1. A laser source system for providing a laser output beam for delivery to a target in an optical instrument, the system comprising:
    two or more diode lasers;
    a control system in communication with said two or more diode lasers, said control system controls one or more outputs of the two or more diode lasers;
    one or more optical fibres delivering one or more output beams of the two or more diode lasers to a desired target; and
    coupling optics connected to said one or more optical fibres, the coupling optics receive the one or more output beams of the two or more diode lasers and direct the one or more output beams into the one or more optical fibres; and
    wherein:
    one or more of the diode lasers is arranged to be selectively operable over a range of output intensity that includes the diode laser's lasing threshold point, the range extends above and below the diode laser's lasing threshold point.

2. The system of claim 1, wherein:
    two or more of the diode lasers have different wavelengths.

3. The system of claim 1, wherein:
the control system includes a means for varying the drive current of one or more of the diode lasers to control the one or more outputs of the one or more diode lasers.

4. The system of claim 1, wherein:
one or more of the diode lasers is selectively placed in a state where it is maintained at its lasing threshold point in order to place the one or more of the diode lasers in an off state.

5. The system of claim 1, wherein:
the one or more optical fibres comprise a single optical fibre into which all the diode laser sources are combined and coupled for delivery to the target.

6. The system of claim 1, wherein:
the one or more optical fibres comprise a plurality of optical fibres for delivering the laser beams to the target.

7. The system of claim 1, wherein:
the coupling optics comprise an adjustable beam steering arrangement for each individual laser.

8. The system of claim 1, wherein:
the system can provide plural output beams simultaneously.

9. The system of claim 1, further comprising:
one or more beam separating or splitting arrangements that can be used to provide plural output beams from a single input beam.

10. The system of claim 1, wherein:
one or more of the diode lasers has a selection device associated with it that can be selectively placed in the path of the beam from the laser to direct it to a desired delivery optical fibre.

11. The system of claim 1, wherein the range of output intensity includes an LED emission state.

12. The system of claim 11, wherein the output intensity of the one or more of the diode lasers is changed from an intensity above the lasing threshold point to the LED emission state and maintained at the LED emission state to shut off the one or more of the diode lasers.

13. The system of claim 11, wherein the output intensity of the one or more of the diode lasers is changed from the LED emission state to an intensity above the lasing threshold point to turn on the one or more of the diode lasers.

14. A method of operating a laser source, comprising:
controlling one or more outputs of two or more diode lasers to provide one or more laser beams for delivery to a target;
coupling the one or more laser beams from the two or more diode lasers into one or more optical fibres; and
providing the one or more laser beams output by the one or more optical fibres to a target in an optical instrument; and
operating one or more of the diode lasers over a range of output intensity that includes the respective diode laser's lasing threshold point, the range extends above and below the diode laser's lasing threshold point.

15. The method of claim 14, further comprising:
varying the drive current for one or more of the diode lasers to control the respective diode laser's output.

16. The method of any one of claim 14, further comprising:
maintaining one or more of the diode lasers at its threshold point in order to place the one or more of the diode lasers in an off state.

17. The method of claim 14, wherein:
the coupling of the one or more optical fibres into the one or more optical fibres is performed using an adjustable beam steering arrangement for each individual laser.

18. The method of claim 14, further comprising:
using one or more beam separating or splitting arrangements to provide plural output beams from a single input beam.

19. The method of claim 14, further comprising:
selectively placing a selection device in the path of the beam from one of said diode lasers to direct it to a desired delivery optical fibre.

20. One or more processor readable storage devices having processor readable code embodied on said processor readable storage devices, said processor readable code for programming said one or more processors to perform a method of operating a laser source that comprises two or more diode lasers whose output laser beam or beams are coupled into one or more optical fibres, and in which the beam or beams output by the optical fibre or fibres are provided for delivery to a target in an optical instrument, the method comprising:
controlling the output of the one or more diode lasers to provide one or more laser beams for delivery to the target; and
operating one or more of the diode lasers over a range of output intensity that includes the respective diode laser's lasing threshold point, the range extends above and below the diode laser's lasing threshold point.

* * * * *